United States Patent [19]

Hall et al.

[11] Patent Number: 5,045,790
[45] Date of Patent: Sep. 3, 1991

[54] INVESTIGATING A SAMPLE USING NMR

[76] Inventors: Laurance D. Hall, 22 Long Road, Cambridge CB2 2QS; Timothy J. Norwood, 49 Jesus Lane, Cambridge, both of England

[21] Appl. No.: 229,156

[22] Filed: Aug. 5, 1988

[30] Foreign Application Priority Data

Aug. 7, 1987 [GB] United Kingdom ................. 8718723

[51] Int. Cl.$^5$ ............................................. G01R 33/20
[52] U.S. Cl. ................................................... 324/307
[58] Field of Search ............... 324/307, 309, 311, 312, 324/313, 314

[56] References Cited

U.S. PATENT DOCUMENTS 4,238,735 12/1980 Muller ................................. 324/314
4,680,546 7/1987 Dumoulin ............................ 324/307

Primary Examiner—Michael J. Tokar
Attorney, Agent, or Firm—Brumbaugh, Graves, Donohue & Raymond

[57] ABSTRACT

A method of investigating a sample using nuclear magnetic resonance comprises
  i) applying a magnetic field across the sample;
  ii) creating zero quantum coherences (ZQCs) within the sample during a preparation period of duration $\tau$;
  iii) allowing the zero quantum coherences to evolve for a period of at least $N\Delta + t_1$, where $\Delta$, $t_1$ are constant time intervals and N is an integer;
  iv) at the end of the step iii) applying a cohernece transfer pulse to create single quantum coherences;
  v) after a period $\tau$, collecting the free induction decay signal from the sample;
  vi) repeating steps ii) to v) with different values of N; and,
  vii) combining at least some of the free induction decay (FID) signals collected to generate the FID due to a single ZQC.

10 Claims, 6 Drawing Sheets

$0° < \alpha \leq 90°$; IF $\beta = 90°$ $\psi = X$
IF $\beta = 45°$ $\psi = Y$

IF MAGNETIC FIELD IS MORE INHOMOGENEOUS THAN 1 PART IN $10^6$ THEN $\theta$ AND $\phi$ NEED NOT BE PHASE CYCLED AND MAY BE GIVEN ANY VALVE (ARBITRARY).

Fig. 3.

IF $\beta = 90°$ $\psi = X$
IF $\beta = 45°$ $\psi = Y$
PHASE CYCLING:
$\phi = x, y, -x, -y$
FOR EACH VALUE OF $\phi$
$\phi 1 = x, y, -x, -y$
GENERALLY, FOR EACH VALUE
OF $\phi n, \phi(n+1) = x, y, -x, -y$ FOR A AND C $\alpha \leq 90°$
FOR B AND D $\alpha < 90°$
FOR OPTIMUM EFFICIENCY $\tau = \tau'''$, AND $\tau' = \tau''$
$t_1$ = EVOLUTION PERIOD.

INVESTIGATING A SAMPLE USING NMR

FIELD OF THE INVENTION

The invention relates to methods for investigating a sample using nuclear magnetic resonance (NMR).

DESCRIPTION OF THE PRIOR ART

It is well known that certain nuclei, for example the hydrogen nucleus, exhibit an intrinsic spin so that when the nucleus is exposed to a magnetic field it will precess around the magnetic field with a frequency $\omega$ known as the Larmor frequency with the spin preferentially aligned in the direction of the magnetic field.

In general, since the nucleus concerned will be surrounded by electrons associated with the chemical structure of the molecule containing the nucleus, the magnetic field experienced by the nucleus will be modified by the screening effect of those electrons. This will cause each chemically different set of nuclei to precess at a slightly different Larmor frequency. This phenomenon, known as chemical shift, reflects the chemical environment of a nucleus and enables the chemical structure of many molecules to be determined by observing the precession frequencies present within the sample.

The intrinsic spin of a spin-$\frac{1}{2}$ nucleus is quantised and can take up one of two states, either parallel or anti-parallel with the main magnetic field. In the presence of the main magnetic field only, the spins will preferentially take up the parallel state, to produce a net magnetisation vector in that direction. However, the injection of energy in the form of a radio frequency pulse will cause a proportion of the nuclei in the sample to change their spin state causing a rotation of the net magnetisation vector from alignment with the main field to a direction dependent on the duration of the pulse. The component of the vector which is perpendicular to the direction of the field can then be observed to precess about it due to chemical shift and scalar couplings.

It has been found that the spins of adjacent magnetic nuclei interact (scalar spin-spin coupling) via the electrons of the intervening bonds. In a simple case of two nuclei, the two spin system can exist in four different states depending on the relative orientations of the respective spins to each other and to the main field. In this instance the spin system will give rise to four single-quantum transitions; in the (conventional) single-quantum coherence spectrum the chemically shifted peak of each spin will be split into two lines, the splitting between which is known as the scalar coupling constant. In general, the number of component lines of a multiplet into which the resonance of a particular spin is split is dependent upon the number and type of adjacent spins.

The energy associated with a simple two spin system in which the spins are labelled A, X is given by the formula:

$$J_{ax}J_aI_x$$

where $J_{ax}$ is the scalar coupling constant and $I_a$, $I_x$ are the nuclear angular momentum vectors associated with each spin. It will be noted that this energy is independent of magnetic field strength.

Knowledge of the scalar coupling constant enables properties of the sample to be derived such as the angle between bonds of adjacent nuclei and the number of intervening bonds. The size of the scalar coupling constant can be obtained by determining the separation between the components of a multiplets within a chemical shift band.

In the past, in order to obtain this information, static magnetic fields of very high homogeneity have been required: to 1 part in $10^9$ to resolve scalar couplings, and to 1 part in $10^7$ to resolve chemical shifts. Recently, techniques have been developed to obtain the information with lower homogeneity fields by making use of zero-quantum coherences (ZQC).

Zero-quantum coherences are phase coherences between sets of coupled, but chemically inequivalent, spins which obey the transition rule $\Delta M = 0$ (where M = magnetisation). Since they are, therefore, spin-forbidden they can neither be created directly by the action of a single pulse on the equilibrium magnetisation of a spin system, nor can they be detected directly as they have no net magnetisation in any direction. Fortunately, both of these problems can be overcome by using an appropriate series of pulses and delays in the form of a two-dimensional experiment.

The biggest drawback to using ZQCs is the unfamiliarity of their spectral parameters. Both their precessional frequencies $\omega_{eff}$ Eq.A, and their scalar couplings, $J_{eff}$, Eq.B, are such as to preclude conventional spectroscopic analysis.

$$\omega_{eff} = \sum_k \Delta m_k \omega_k \quad \text{(A)}$$

$$J_{eff} = \sum_k \Delta m_k J_{km} \quad \text{(B)}$$

Both equations refer to a ZQC consisting of spins K which, in the case of EQ.B, are coupled to a passive spin m. Eq.B. imposes a particularly severe limitation on ZQC spectral analysis, as it means that ZQC scalar couplings cannot be used to trace scalar coupling networks. Thus, in contrast to the conventionally observed single-quantum coherences, ZQCs arising from a common spin system will not in general exhibit numerically equal couplings, even if they have spins in common. Several relatively unsuccessful attempts have previously been made to overcome this limitation.

SUMMARY OF THE INVENTION

In accordance with one aspect of the present invention, a method of investigating a sample using nuclear magnetic resonance comprises:

i) applying a magnetic field across the sample;

ii) creating zero quantum coherences (ZQCs) within the sample during a preparation period of duration $\tau$;

iii) allowing the zero quantum coherences to evolve for a period of at least $N\Delta + t_1$, where $\Delta$, $t_1$ are constant time intervals and N is an integer;

iv) at the end of the step iii) applying a coherence transfer pulse to create single quantum coherences;

v) after a period $\tau$, collecting the free induction decay signal from the sample;

vi) repeating steps ii) to v) with different values of N; and, vii) combining at least some of the free induction decay (FID) signals collected to generate the FID due to a single ZQC.

This technique allows all but a single ZQC, selected by its precessional frequency, to be filtered out from the ZQC spectrum, and, by means of a coherence transfer other ZQCs which are part of the same spin system can be made to reappear.

In some cases $t_1$ may be zero in which case, upon fourier transform of the FID obtained, a 1D spectrum is obtained consisting soley of signals from the spin system from which the selected ZQC arose (providing a method B filter is used to be described below).

In its simplest form, the technique works by combining two or more FIDs from separate experiments with different values of N allowing free precession to occur for differing times before the start of acquisition or collection (step v). The difference in free precession time between consecutive experiments is chosen such that only the coherence that one wishes to preserve will have the same phase in each case and will therefore constructively interfere when the FIDs are co-added while all other coherences will destructively interfere and hence cancel each other out.

There are several methods which can be used to generate zero quantum coherences. One common pulse sequence comprises a 90° radio frequency pulse in the X direction, a relaxation period of duration $\tau/2$, a 180° radio frequency pulse in the Y direction followed by a further relaxation period of duration $\tau/2$ and a final 90° pulse in the X direction. It is assumed that the main magnetic field extends in the Z direction.

In one example, $\Delta$ is chosen to be equal to $\pi/\omega_{ZQC}$, where $\omega_{ZQC}$ is the frequency of the ZQC chosen to pass through the filter, and step v) comprises adding the FID signal collected after each step iii) in which N is an odd integer.

Conveniently, steps ii) and v) include applying a 180° radio frequency pulse at a time $\tau/2$ after commencement of the relevant period. The advantage of this is that the pulse removes effects on intensity due to chemical shift evolution during these periods from the resultant spectrum.

In a modified form, step iii) has a duration of $N\Delta + \tau' + t_1$, an additional pulse $\alpha_\theta$ being applied after a time $N\Delta + \tau'$, wherein $0° < \alpha \leq 90°$, and wherein $\theta$ indicates a direction orthogonal to the magnetic field direction.

The advantage of this modification is that having filtered all but a chosen ZQC from the spectrum, ZQCs which either consist of spins to which it is coupled, or which are active within it, can be made to reappear.

We have developed a method of analysing the resultant spectra which assumes that all the spins under consideration would have mutual non-zero scalar couplings. For a ZQC to be excited between a set of N spins, it is necessary for at least one of those spins to have resolved scalar couplings to all of the rest. If this assumption is not true the anti-phase single quantum coherences (SQC) from which the ZQC is generated will not occur and not all of the expected ZQCs will appear in the spectrum. In practice, this could render our new analysis of marginal interest since the magnitudes of couplings for as few as four bonds are often negligible.

To deal with this, we provide in accordance with a second aspect of the present invention a method of investigating a sample using nuclear magnetic resonance comprising i) applying a magnetic field across the sample;

ii) creating zero quantum coherences within the sample during a preparation period of duration $\tau$;

iii) after a period $t'$, subsequent to step ii), applying a first coherence transfer pulse $\alpha_\theta$;

iv) after a further period $t_1$, applying a second coherence transfer pulse $\alpha_{\theta 1}$;

v) after a further period $\tau''$, applying a coherence transfer pulse to create single quantum coherences; and, vi) after a period $\tau'''$ collecting the free induction decay signal from the sample.

This new pulse sequence is distinguished from the conventional ZQC pulse sequence mentioned above in that it incorporates two additional delays and two or more additional rf pulses. The purpose of the additional delays is to allow evolution between in-phase and anti-phase ZQC. The purpose of the additional pulses is to effect a transfer of coherence between those ZQCs present immediately prior to them and any ZQCs which may be generated from the spins which either participate in those ZQCs, or to which they were coupled.

Preferably, $\tau = \tau'''$ and $\tau' = \tau''$. Furthermore, $\alpha$ preferably lies between 0° and 180°.

In general, the pulse sequence in accordance with the second aspect of the invention will need to be repeated at least once with $\theta$ and $\theta 1$ being phase cycled.

BRIEF DESCRIPTION OF THE DRAWINGS

Some examples of methods in accordance with the present invention will now be described with reference to the accompanying drawings, in which;

FIGS. 4A–4H illustrate zero-quantum spectra for a 0.1M solution of L-alanine, L-threonine, and L-valine in $D_2O$ obtained in a magnetic field with a homogeneity of 5 parts in $10^5$ using different pulse sequences while FIG. 4I illustrates a conventional 300 MHz $^1H$ single-quantum coherence spectrum for the same solution;

DETAILED DESCRIPTION OF THE EMBODIMENTS

Figure 1:
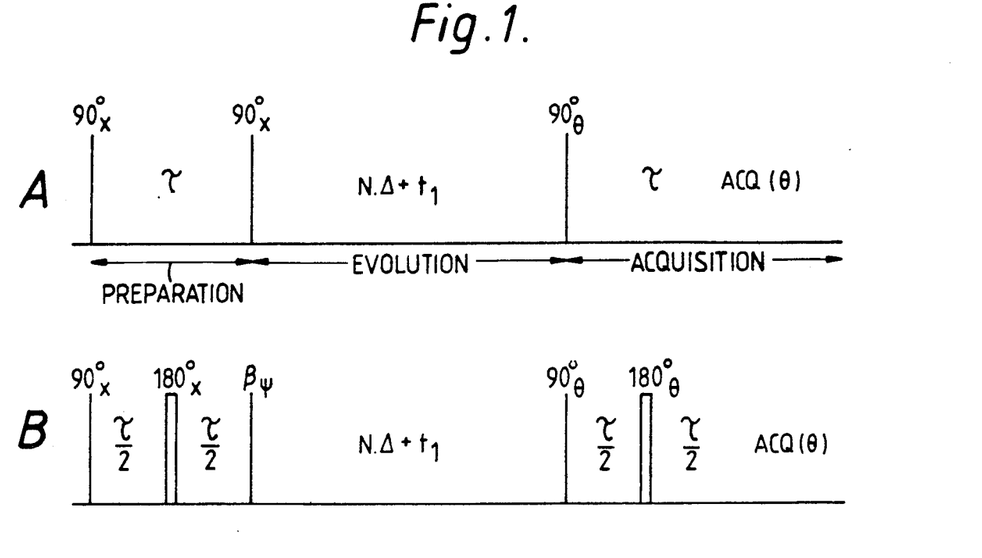
FIGS. 1A and 1B illustrate pulse sequences for producing filtered zero-quantum coherence spectra; providing a Method B filter is used, if $t_1$ is omitted, the 1D spectra produced will contain only signal originating from the spin system from which the selected ZQC arose (true for 1A, 1B, 2A, 2B)

FIG. 1A illustrates a basic pulse sequence for producing filtered zero-quantum coherence spectra. This sequence comprises a zero quantum coherence preparation period of duration $\tau$. At the beginning of this period a 90° rf pulse is injected into the sample in the X direction of an orthogonal coordinate system with axes X,Y,Z. At the end of the period, a further 90° pulse is injected in the X direction. This is followed by an evolution period of duration $N\alpha + t_1$. At the end of the evolution period a coherence transfer pulse ($90°_\theta$) is injected and after a further period $\tau$, the resulting free induction decay signal is acquired in the direction $\theta$.

Typically, $\theta$ will be phase cycled in a conventional manner when the magnetic field has a homogeneity better than 1 part in $10^6$.

FIG. 1B illustrates a modified form of the FIG. 1A sequence in which an additional $180°_X$ pulse is injected into the sample in both the preparation and acquisition periods.

Ignoring scalar couplings, a ZQC $(ZQC)_y$ present at the beginning of the evolution period will evolve during the total evolution time $(N \cdot \Delta + t_1)$ into:

$$(ZQC)_y \cos((N \cdot \Delta + t_1)\omega_{eff}) + (ZQC)_x \sin((N \cdot \Delta + t_1)\omega_{eff}). \quad (1)$$

Filtration is accomplished by acquiring FIDs with several different values N for each $t_1$ value. These are then added if Eq. 1 is invariant with respect to N for the ZQC chosen to pass through the filter, or, if it is not invariant, the phase of the receiver is cycled in such a way that it *appears* to be so to the observer. Since ZQC is usually *amplitude* encoded, the only phases that can be determined uniquely are 0° and 180°; any other phase $\phi$ is indistinguishable from $(360° - \phi)$. The approximation of independence of scalar couplings is only valid insofar as the variation in the extent of scalar coupling evolution with the range of N values used is negligable. If this approximation is not valid then the intensity of the outer extremities of the ZQC multiplet will be attenuated. We distinguish between two variant methods of filtration:

Method A. $\Delta = (2\pi/\omega_{ZQC})$ where $\omega_{ZQC}$ is the frequency of the ZQC chosen to pass through the filter. All FIDs for different values of N are co-added, where $N = 1, 2, 3 \ldots n$. The frequency characteristic, $A(\omega)$, of the filter is given by Eq. 2, and its $$A(\omega) = (1/n) \sum_{N=1}^{n} \cos(N \cdot \Delta \cdot \omega) \quad (2)$$

transmission bandwidth (defined as the distance between the first two points of zero intensity on each side of $\omega_{ZQC}$) as a fraction of $\omega_{ZQC}$ will be equal to $(1/(n+1))$. It can be seen from Eq. 2 that additional transmission bands will occur at 0.0, $2 \cdot \omega_{ZQC}$, $3 \cdot \omega_{ZQC}$, $4 \cdot \omega_{ZQC} \ldots$ etc in the F1 dimension of the spectrum.

Method B. $\Delta = (\pi/\omega_{ZQC})$ where $\omega_{ZQC}$ is the frequency of the ZQC chosen to pass through the filter. FIDs obtaining for odd values of N are co-added and those obtained with even values of N co-substracted, where $N = 1, 2, 3 \ldots n$. The frequency characteristic, $A(\omega)$, of the filter is given by Eq. 3, and its transmission $$A(\omega) = (1/n) \sum_{N=1}^{n} (-1)^{N+1} \cos(N \cdot \Delta \cdot \omega) \quad (3)$$

bandwidth as a fraction of $\omega_{ZQC}$ will be equal to $(2/(n+1))$. Additional transmission bands will occur (Eq. 1) at $3 \cdot \omega_{ZQC}$, $5 \cdot \omega_{ZQC}$, $7 \cdot \omega_{ZQC} \ldots$ etc in the F1 dimension of the spectrum.

For a given value of n, Method A has the advantage of giving the narrowest transmission bandwidth ... half that of Method B ... although Method B has the advantage of letting through fewer additional unwanted bands; Method B only transmits additional bands at odd integer multiples of $\omega_{ZQC}$, whereas Method A passes additional bands at *all* integer multiples of $z_{QC}$. Clearly Method A is to be prefered where there is no danger of unwanted ZQCs slipping through at multiples of $\omega_{ZQC}$, which is obviously the case when $\omega_{ZQC} > F\frac{1}{2}$. However, when $F\frac{1}{2} > \omega_{ZQC} > F\frac{1}{3}$ only Method B offers this assurance. When $\omega_{ZQC} < F\frac{1}{3}$, Method B, with its fewer additional windows, although no longer imperveous to unwanted coherences, is more likely to secure their exclusion.

Figure 4:
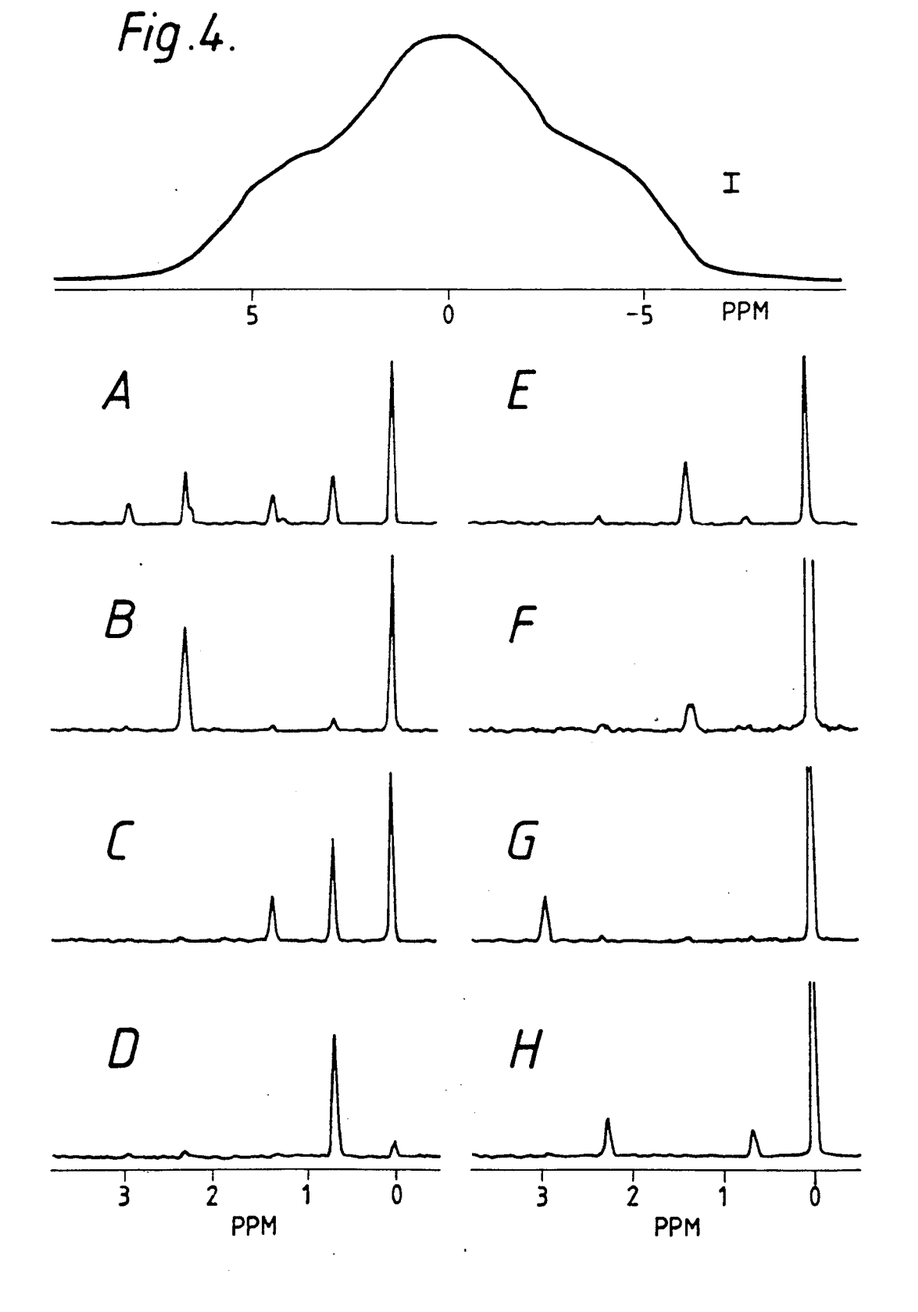

Method A is demonstrated on a mixture of amino acids in FIG. 4B, where all except two overlapping ZQCs from alanine and threonine have been removed from the spectrum. When applied on the innermost threonine resonance, FIG. 4C, however, Method A proved to be inadequate since a valine ZQC occurs at almost twice the frequency and hence passed through the $2 \cdot \omega_{ZQC}$ window. Method B, which does not have this additional window, effectively removed all unwanted ZQCs (FIG. 4D). Some of the peaks ostensibly "filtered out" are still visible in these spectra, although at much reduced intensity: the efficiency of their supresion may be increased by increasing the range of N values used.

Having filtered all but a chosen ZQC from the spectrum, ZQCs which either consist of spins to which it is coupled, or which are active within it, can be made to reappear using the pulse sequence summarised in FIG. 2B. This pulse sequence differs from that in FIG. 1B in that it includes an additional delay and an additional pulse. This delay allows a ZQC such as $(12)_y$ (a component of ZQC consisting of spins 1 and 2), created at the end of the preparation period, to evolve (13) due to its precessional frequency, and its scalar couplings to other passive spins, for example 3, into antiphase ZQC terms such as $(12)_y 2 \cdot I_{3z}$. The subsequent pulse $\alpha$ will convert this into terms including $(13)_y 2 \cdot I_{2z}$ and $(23)_y 2 \cdot I_{1z}$; i.e. coherence will be transfered from the ZQC 12, to 13 and 23. All ZQCs thus created from the ZQC selected by the filtration process described above will be encoded in the data matrix with respect to $t_1$ and will, therefore, be present in the F1 spectrum. All other ZQC will cancel out when, for each value of $t_1$, the FIDs obtained with different values of N are combined.

The performance of this pulse sequence (FIG. 2B) is demonstrated in FIG. 4F and H. In the case of valine, the ZQC was first selected, FIG. 4E, using the pulse sequence given in FIG. 1B. That no additional ZQCs were observed when the second pulse sequence was applied reflects the fact that no other ZQCs in the spectrum arise from the same spin system. However, in the case of the threonine resonance selected in FIG. 4G, application of the second pulse sequence (FIG. 2B) revealed that two other ZQCs in the spectrum did also arise from the same spin system. Although in this second case all coherence of the ZQC initially selected has been transferred to other coherences, this will not always be the case as can be seen from FIG. 4F. This is because the efficiency of the coherence transfer brought about by $\alpha$ is dependent upon both the length of the period $(N \cdot \Delta + \tau')$, and the parameters of the spin system under consideration. Some reduction in the total ZQC intensity is to be expected after the coherence transfer pulse α, due to coherence being transfered to other orders of multiple-quantum coherence.

With the aid of the above results it is possible to confirm that the mixture of molecules used in these experiments contained three distinct spin systems: of the 5 ZQCs present with significant intensity in FIG. 4A, three were found to be part of one spin system (threonine, FIG. 4H); one ZQC was found to be part of another (valine, FIG. F); leaving one remaining ZQC (alanine) which overlapped with one of the threonine ZQCs.

It is important never to assume that a ZQC spectrum obtained with just one value of τ (the length of the preparation period) is complete, since the efficiency of ZQC excitation is critically dependent upon the value of this parameter. Consequently, it is possible that the coherence transfer pulse may give rise to other ZQCs in addition to those initially excited. However, even if such ZQCs do arise in the modified pulse sequence, FIG. 2B, the editing effect of the refocussing period (analogous to that of the preparation period) is likely to ensure their continued absence from the spectrum, or at least to attenuate them substantially. This additional, and usually unsought, editing effect of the refocussing period stems from the fact that in inhomogeneous magnetic fields, acquisition time is of necessity often very short (ie. a few millisecond) and as a consequence only that magnetisation which is in-phase directly at the end of the refocussing period will be observed: the acquistion time is too short for significant scalar coupling evolution to take place within it. In a homogeneous magnetic field one is free to choose an acquisition time that is several orders of magnitude longer, and consequently there will be time for significant scalar coupling evolution to occur and hence for different components of magnetisation to become in-phase during the course of acquisition.

FIG. 2A illustrates a simplified form of the pulse sequence shown in FIG. 2B in which the 180° pulses in the preparation and acquisition periods have been omitted.

Figure 2:
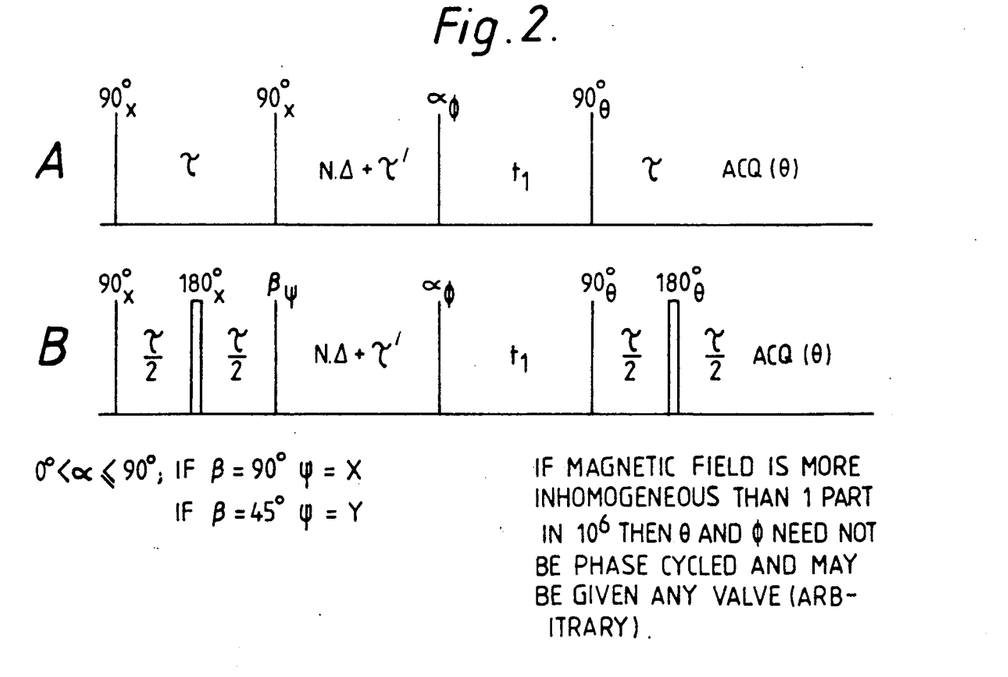
FIGS. 2A and 2B illustrate pulse sequences for producing zero-quantum spectra containing only those zero-quantum coherences arising from the same spin system as the one initially selected by the filter.

It should be noted that the constraints on the values of α and β are set out in FIG. 2.

In SQC spectroscopy, the magnitudes of multiplet splittings are used to trace scalar coupling networks; in contrast, for ZQC spectroscopy this is not possible for the reasons outlined above. However, the analysis of ZQC spectra given below, which we denote ZEUS (ZEro qUantum coherence Sequencing), reveals logical relationships between different ZQCs which either arise from Different spins from the same mutually coupled set (ZEUS-D), or have a spin in Common (ZEUS-C).

The ZEUS-D analysis (for ZQCs consisting of different but mutually coupled spins) relies upon the fact that ZQCs can be generated between sets of four as well as sets of two coupled spins $\underline{k}$, for which the transition rule $\Delta M=0$ applies, where $$\Delta M = \sum_{k} \Delta m_k. \qquad (4)$$

Four mutually coupled spins, A, B, C and D, will, for example, give rise to two two-spin ZQCs AB and CD at the frequencies $\omega_{AB}$ (i.e. $\omega_A - \omega_B$) and $\omega_{CD}$. In addition to these two-spin ZQCs, there will also be four-spin coherences between all four spins, ABCD, which will have precessional frequencies given by Eq. 5.

$$\omega = \sum_{k} \Delta m_k \omega_k \qquad (5)$$

There are six possible combinations of $\Delta m_k$ values which obey the transition rule given in Eq. 4, resulting in three distinct precessional frequencies. These combinations and the corresponding transition frequencies are given in Table 1; where possible, the transition frequencies are given as combinations of the transition frequencies of AB and CD. Clearly, the latter three combinations are the negative counterparts of the first three; combinations 2 and 3 correspond to the sum and difference respectively of the frequencies of AB and CD. Therefore, the presence of peaks at the sum and difference of two ZQCs confirm that their constituent spins belong to the same mutually coupled set.

Clearly, this will only be true for two ZQCs consisting of different, but mutually coupled, spins. However, for ZEUS-C, when the two ZQCs have a spin in common the relationship will not hold, except when the two coherences AB and BC arise from a spin system of the type $AB_2C$; this may be regarded as a special case of an ABCD spin system in which B and D are degenerate. In this case 4-spin ZQCs will occur at $$(\omega_A-\omega_B)+(\omega_C-\omega_B) \text{ and } (\omega_A-\omega_B)-(\omega_C-\omega_B),$$

TABLE 1

Precessional frequencies of the 4-spin ZQCs arising from the set of spins A, B, C and D. Columns 1–4 contain all possible permutations of the change in magnetic quantum numbers of the individual spins which obey the collective ZQC transition rule $\Delta M=0$. Column 5 contains the precessional frequencies of the resulting ZQCs calculated according to Eq. 5.

| $\Delta m_A$ | $\Delta m_B$ | $\Delta m_C$ | $\Delta m_D$ | $\omega_{ABCD}$ |
|---|---|---|---|---|
| +1 | +1 | −1 | −1 | (A − C) + (B − D) |
| +1 | −1 | +1 | −1 | (A − B) + (C − D) |
| +1 | −1 | −1 | +1 | (A − B) − (C − D) |
| −1 | +1 | +1 | −1 | −[(A − B) − (C − D)] |
| −1 | +1 | −1 | +1 | −[(A − B) + (C − D)] |
| −1 | −1 | +1 | +1 | −[(A − C) + (B − D)] | which are the sum and difference respectively of the two two-spin ZQCs.

Two ZQCs AB and BC arising from a spin system of the type ABC clearly cannot have 4-spin ZQCs at their sum and difference. However, that system will give rise to a third ZQC, AC. If the spin B resonates between A and C in the SQC spectrum then:

$$\omega_{AC}=\omega_{AB}+\omega_{BC},$$

and AC will occur at the sum of the precessional frequencies of AB and BC. However, if B does not resonate between A and C then either $$\omega_{AB}=\omega_{AC}+\omega_{BC}$$

and hence:

$$\omega_{AC}=\omega_{AB}-\omega_{BC},$$

or, $$\omega_{BC} = \omega_{AB} + \omega_{AC}$$

and hence:

$$\omega_{AC} = -(\omega_{AB} - \omega_{BC}).$$

In either case the ZQC AC will be found in the ZQC spectrum at the difference in frequencies of AB and BC.

The presence of either a sum or a difference peak, but not both, indicates that two ZQCs have a spin in common; the presence of both sum and difference peaks indicates that the two ZQCs do not have a spin in common, but arise out of different spins from the same mutually coupled set. In both of these cases the analysis can be extended further, confirming the relationship between the two ZQCs and providing additional information about the relative positions of their constituent spins within the SQC spectrum.

Figure 6:
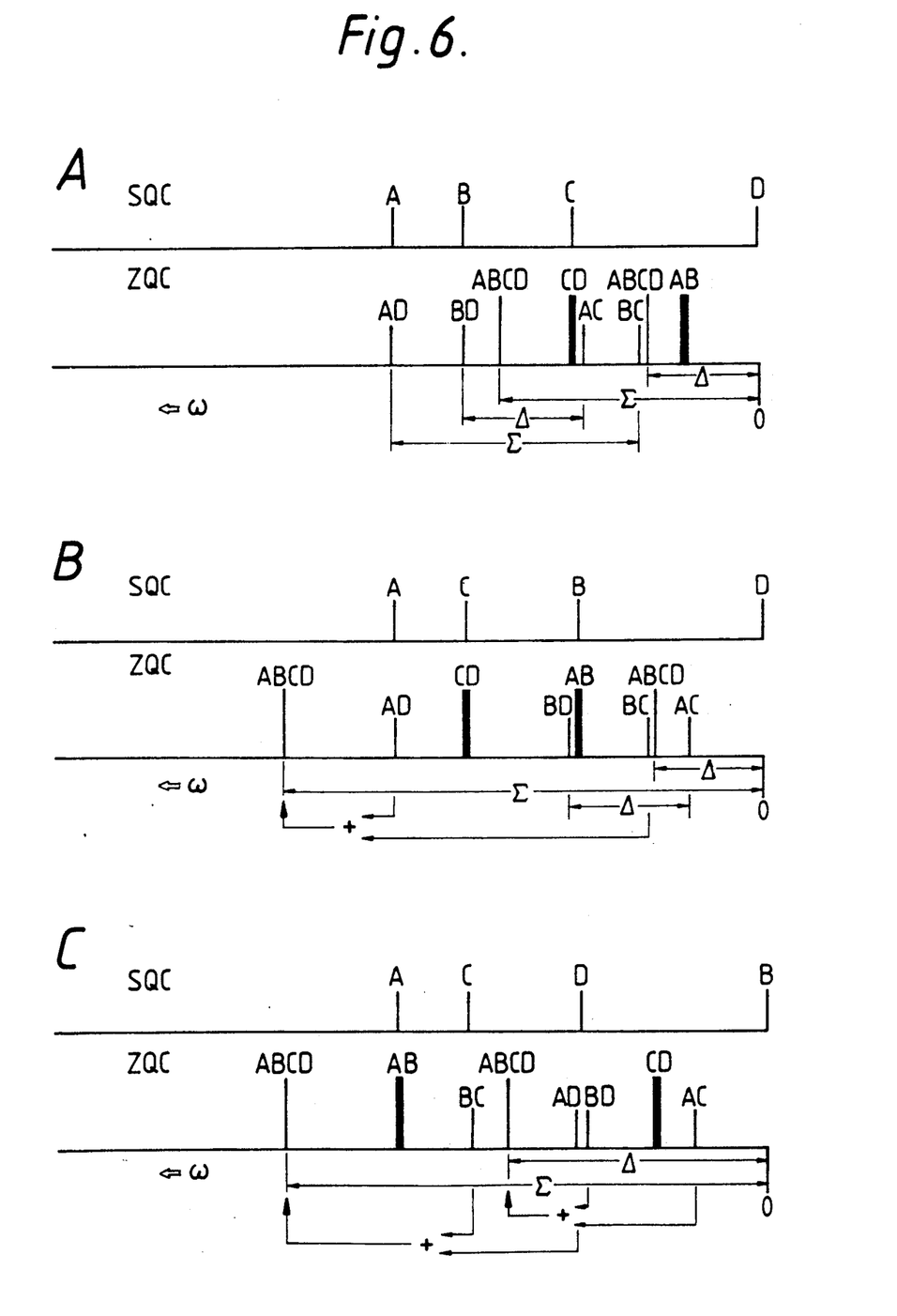
FIGS. 6A–6C are diagrammatic representations of the Zeus-D analysis for two ZQCs, AD and CD, belonging to the same set of mutually coupled spins; and, FIGS. 7A–7D are diagrammatic representations of the Zeus-C analysis for two ZQCs, AB and BC having the spin B in common.

An extended ZEUS-D analysis of two ZQCs, AB and CD, is given diagramatically in FIG. 6. This gives additional information on the relative positions of the frequency spaces between A and B, and C and D in the SQC spectrum. For the case represented in FIG. 6A the frequency region bounded by A and B in the SQC spectrum does not overlap with that bounded by C and D, whereas for the case in FIG. 6B there is partial overlap, and in FIG. 6C total overlap. This additional information is a result of the identification and analysis of the additional pairs of 2-spin ZQCs which may arise from the four spins: AC and BD and AD and BC. In each case, if they are present, they can be identified by the fact that their frequencies are related in some way to either the sum or the difference of the frequencies of AB and CD. For example, in the case represented in FIG. 6A BD and AC are separated by $\Delta$, the difference in frequencies of AB and CD, and AD and BC are identifiable because they are separated by $\Sigma$, the sum of the frequencies of AB and CD. For the case represented in FIG. 6B the sum of AD and BC is equal to $\Sigma$, and the difference between BD and AC is equal to $\Delta$. In the case represented in FIG. 6C the sum of BD and AC is equal to $\Delta$, and the sum of CB and AD is equal to $\Sigma$. As stated above, besides confirming the prior simpler analysis, this characterisation of the extended peak pattern is sufficient to deduce the relative positions of the two pairs of spins, A and B and C and D in the SQC spectrum. However, it should be noted that no absolute frequency information is gained and a knowledge of which spin in each pair has the highest frequency remains inaccessable.

In each case in FIG. 6, the upper line represents the single quantum coherence (SQC) spectrum and the lower line the ZQC spectrum. The tall bold face lines in the ZQC spectrum represent the two ZQCs whose relationship is under consideration. The other tall lines represent 4-spin ZQCs at the sum, $\Sigma$, and difference, $\Delta$, in frequencies of these two ZQCs. The short thin lines represent ZQCs concerned with the extended ZEUS analysis. The symbol "+" means that the sum of the frequencies of the two ZQCs indicated is equivalent to that of the ZQC indicated by the following arrow; this will be at either $\Sigma$ or $\Delta$.

The extended Zeus-C is similar, although in this case its primary importance is to confirm the previous assignment rather than to seek additional information about the spin system. In the case of ZEUS-D the identification of peaks at both the sum and difference of the frequencies of two ZQCs is reasonably conclusive evidence that their relationship actually is of the ZEUS-D type and not ZEUS-C. However, if only one or the other of the sum and difference peaks is present, a further question must be asked: is this a genuine case of ZEUS-C or just a case of ZEUS-D in which one of the sum and difference peaks has not been excited, or is below the detection threshold?

One of the drawbacks of the pulse sequences used to acquire ZQC spectra in inhomogeneous fields (and in general) is that the intensities of ZQCs excited are dependent upon both the scalar couplings of the spins which participate in them and the length of the ZQC preparation period. Under some circumstances it is useful to be able to use this dependency to remove ZQCs from a spectrum, under other it is just a nuisance! Fortunately an extended analysis should remove much of the ambiguity since the relationships between the additional ZQCs considered is significantly different in the two cases. For a pair of ZQCs consisting of different spins from the same mutually coupled set there will be four additional peaks, two related to $\Sigma$ and two related to $\Delta$. In the case of two ZQCs with a common spin, additional pairs of peaks will only be related to $\Sigma$ if AC occurs at $\Sigma$, and to $\Delta$ if AC occurs at $\Delta$. For ZEUS-C the analysis must be extended to passive spins as the possibilities for ZQCs between A, B and C have already been exhausted. Here, just one passive spin is considered which has resolved couplings to spins A and C. The analysis is given in FIG. 7. In addition to confirming the previous, simpler, analysis, it is possible to deduce whether the passive spin resonates inside or outside the region bounded by A and C in the SQC spectrum. As before, no absolute frequencies are obtained and neither is the highest frequency spin within each pair revealed.

Figure 7:
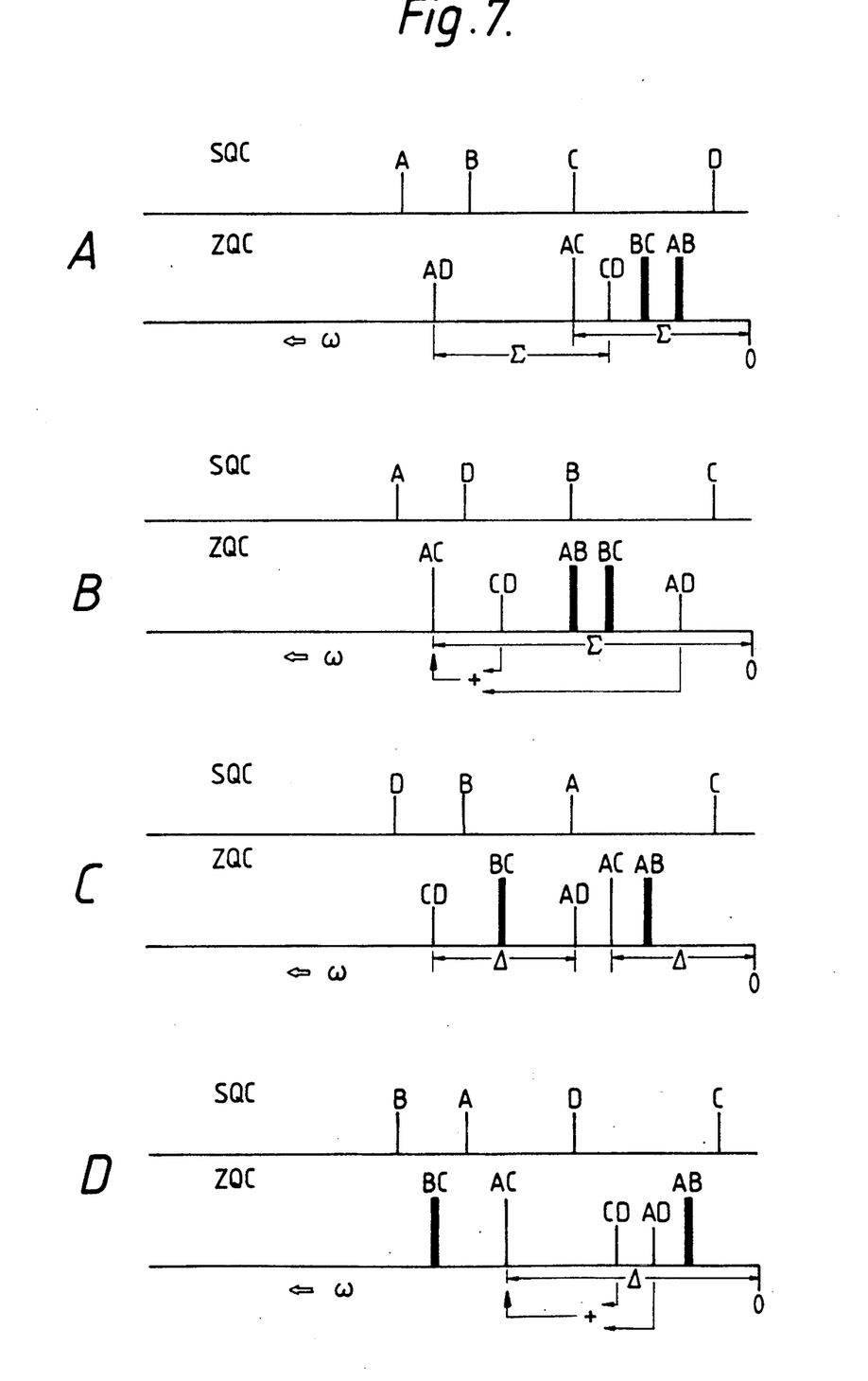

In the case of ZEUS-C there are four distinct cases: FIG. 7 (A) The spin B is within the SQC frequency range between spins A and C, and D is outside of this range. FIG. 7(B) The spin B is within the SQC frequency range between A and C, and so is D. FIG. 7(C) The spin B is outside of the SQC frequency range between A and C, as is D. FIG. 7(D) The spin B is outside the SQC frequency range between A and C, but D is inside it. In each case the upper line represents the SQC spectrum and the lower line the ZQC spectrum. The tall bold face lines represent those ZQCs whose relationship is under consideration. The other tall lines represents a ZQC at the sum, $\Sigma$ or difference, $\Delta$, of these ZQCs. The short thin lines represent ZQCs concerned with the extended ZEUS analysis. The symbol "+" indicates that the sum of the frequencies of the two ZQCs indicated is equal to that of the ZQC indicated by the arrow; this will be either $\Sigma$ or $\Delta$.

Zero-quantum coherences cannot be created directly by the action of a single r.f. pulse on the magnetisation of a spin system at equilibrium, and neither can they be detected directly since they have no net magnetisation in any direction. Consequently, both creation and detection must be accomplished by using a series of pulses and delays. In an inhomogeneous magnetic field there is the additional requirement that any dephasing due to magnetic field inhomogeneity must be eliminated. There are two excitation sequences in common use which fulfill this requirement:

$$90_x - \tau/2 - 180_y - \tau/2 - 45_y$$

and $$90_x - \tau/2 - 180_y - \tau/2 - 90_x.$$

The former excites ZQCs between all pairs of coupled spins with different chemical shifts, whereas the latter has the additional qualification that it will not excite ZQCs from spin systems of the type $A_nX_n$, although those ZQCs it does excite are excited with greater efficiency. Clearly, when the object is to trace scalar coupling networks the presence of the single ZQC produced by such spin systems will not provide any useful information, and may even obscure "useful" peaks. Consequently, only the latter excitation sequence will be discussed here.

The first 90° pulse will convert the longitudinal magnetisation of a spin, $1$, into a (SQC) magnetisation vector, $-I_{1y}$, along the y-axis of the rotating reference frame. This magnetisation will evolve during $\tau$ solely due to its scalar couplings with its $\lambda^{(N-1)}$ coupling partners (neglecting relaxation), chemical shift and magnetic field inhomogeneity evolution being cancelled out by the 180° pulse at $\tau/2$. The resulting antiphase SQC (described using the product operator formalism) includes terms such as:

$$2I_{1x}I_{2z}\sin(\pi J_{12}\tau) \prod_{i=3}^{N} \cos(\pi J_{1i}\tau),$$

$$4I_{1y}I_{2z}I_{3z}\sin(\pi J_{12}\tau)\sin(\pi J_{13}\tau) \prod_{i=4}^{N} \cos(\pi J_{1i}\tau), \text{ and}$$

$$8I_{1x}I_{2z}I_{3z}I_{4z} \prod_{i=2}^{4} \sin(\pi J_{1i}\tau) \prod_{j=5}^{N} \cos(\pi J_{1j}\tau).$$

The first term contains the product operator $2I_{1x}I_{2z}$ which describes SQC of the spin 1 antiphase due to its scalar coupling to the spin 2. The rest of the term describes the amplitude of the product operator, and can be seen to be dependent upon the spin's scalar couplings and the length of the preparation period $\tau$. The second and third terms consist of SQC of the spin 1 antiphase with respect to two and three other spins respectively. These product operators are converted by the second 90° pulse into $2I_{1x}I_{2y}$, $4I_{1z}I_{2y}I_{3y}$, and $8I_{1x}I_{2y}I_{3y}I_{4y}$ respectively (omitting their amplitudes). The first term now consists of 2-spin coherences (a mixture of zero- and double-quantum coherence) of spins 1 and 2, whereas the second term consists of two-spin coherences of spins 2 and 3 antiphase with respect to spin 1. The third term consists of four-spin coherences. Each term consists of a mixture of coherence. For two-spin terms pure ZQC is given by Eqs. 6 and 7.

$$ZQC(1,2)_x = \tfrac{1}{2}(2I_{1x}I_{2x} + 2I_{1y}I_{2y}) \quad (6)$$

$$ZQC(1,2)_y = \tfrac{1}{2}(2I_{1y}I_{2x} - 2I_{1x}I_{2y}) \quad (7)$$

Other terms can be analysed in a similar manner.

For the purposes of the discussion of the ZEUS analysis it was assumed that all the spins under consideration would have mutual non-zero scalar couplings, an ideal from which reality often departs. For a ZQC to be excited between a set of N spins, it is necessary for at least one of those spins to have resolved scalar couplings to all of the rest; if this assumption is not true the antiphase SQC from which the ZQC is generated will not occur and not all of the expected ZQCs will appear in the spectrum. This would seem to make ZEUS of marginal interest at best, as the magnitudes of couplings through as few as 4 bonds are often negligable.

However by using a MUltiple Stage Excitaion (MUSE for short) excitation sequence, in this case consisting of two stages, it is possible to create ZQCs between a set of spins, even when no single spin is coupled to all the rest. For a spin system ABCD such that only $J_{AB}$, $J_{BC}$ and $J_{CD}$ are non-zero, the conventional ZQC excitation sequence will only excite the ZQCs AB, BC and CD. The ZQC ABCD will not be excited as the antiphase SQC terms from which it is generated, such as $8I_{Ax}I_{Bz}I_{Cz}I_{Dz}$, will not arise because one or more of the relevant scalar couplings, in this case $J_{AC}$ and $J_{AD}$, is equal to zero. However, one of those ZQCs which are created, BC, will have non-zero scalar couplings to both spins A and D, the amplitudes of which can be calculated from Eq. 8, where m is a passive spin which is coupled to a coherence consisting of spins k with an effective coupling constant $J_{eff}$:

$$J_{eff} = \sum_{k} \Delta m_k J_{mk} \quad (8)$$

In this example BC will couple to A and D with effective coupling constants $(J_{AB}-J_{AC})$ and $(J_{CD}-J_{BD})$ respectively; since both $J_{AC}=0$ and $J_{BD}=0$, these reduce to $J_{AB}$ and $J_{CD}$ which are defined as being non-zero. Consequently, it can be shown that the component of ZQC, $ZQC(B,C)_y$, generated by the second 90° pulse in the excitation sequence will evolve during a subsequent time $\tau'$ due to precession and scalar couplings into terms including: $ZQC(B,C)_x 4I_{Az}I_{Dz}\sin(\pi J_{AB}\tau')\sin(\pi J_{CD}\tau')\cos(\omega_{BC}\tau')$, Where the precessional frequency $\omega_{BC}$ is defined according to Eq. 5. A third 90° pulse will now convert this term into four-spin coherences, including the desired ZQC, ABCD. Since detection of ZQCs is essentially the reverse of their creation, a two-stage detection sequence is also needed. A simple MUSE sequence which performs this function in an inhomogeneous magnetic field is given in FIG. 3c. As well as exhibiting the dependencies on experimental parameters of the conventional ZQC pulse sequence, this sequence is additionally dependent both on $\tau'$ and on the scalar couplings and precessional frequencies of the ZQCs which exist during that interval.

A very simple form of the new MUSE sequence is illustrated in FIG. 3A with FIG. 3B illustrating a slightly more complex version in which 180° pulses have been inserted into the evolution period.

The MUSE pulse sequence is distinguished from the conventional ZQC pulse sequence in that it incorporates two additional delays and two additional r.f. pulses. The purpose of the additional delays is to allow evolution between in-phase and antiphase ZQC. The purpose of the additional pulses is to effect a transfer of coherence between those ZQCs present immediately prior to them, and any ZQCs which may be generated from the spins which either participate in those ZQCs, or to which they were coupled. Coherence will unavoidably be transferred to other orders of multiple-quantum coherence besides ZQC, and as a consequence of this the intensity of ZQC will be reduced.

One of the drawbacks of using ZQC is its relatively narrow spectral width which results in a larger degree of peak overlap than would be found in the corresponding SQC spectrum. By using MUSE with a small value of $\alpha$ (e.g. 22.5°) the introduction of any additional peaks into the ZQC spectrum will be largely restricted to those which are of relevance to the ZEUS analysis of the peaks initially excited. In addition, this may be used in conjunction with $\tau$-editing whereby many peaks are first edited out of the spectrum by utilising their dependencies on $\tau$, before MUSE is implemented to excite only those additional peaks necessary to analyse the remainder.

The intensities of the ZQCs produced by MUSE are dependent upon the precessional frequencies of the intermediate ZQCs present during $\tau$. This dependency can be removed by inserting a 180° pulse at the centre of $\tau'$(FIG. 3C). However, if this is done, then $\alpha$ may not be 90° since for this value only odd orders of multiple-quantum coherence will be generated. For this version of MUSE, which will hereafter be refered to as MUSE-1, only the first and alternate rows of Table 2 apply. It will be observed that these rows show no coefficients solely dependent on $\sin(\alpha)$, hence the absence of ZQCs when $\alpha = 90°$.

EXPERIMENTAL RESULTS

Figure 5:
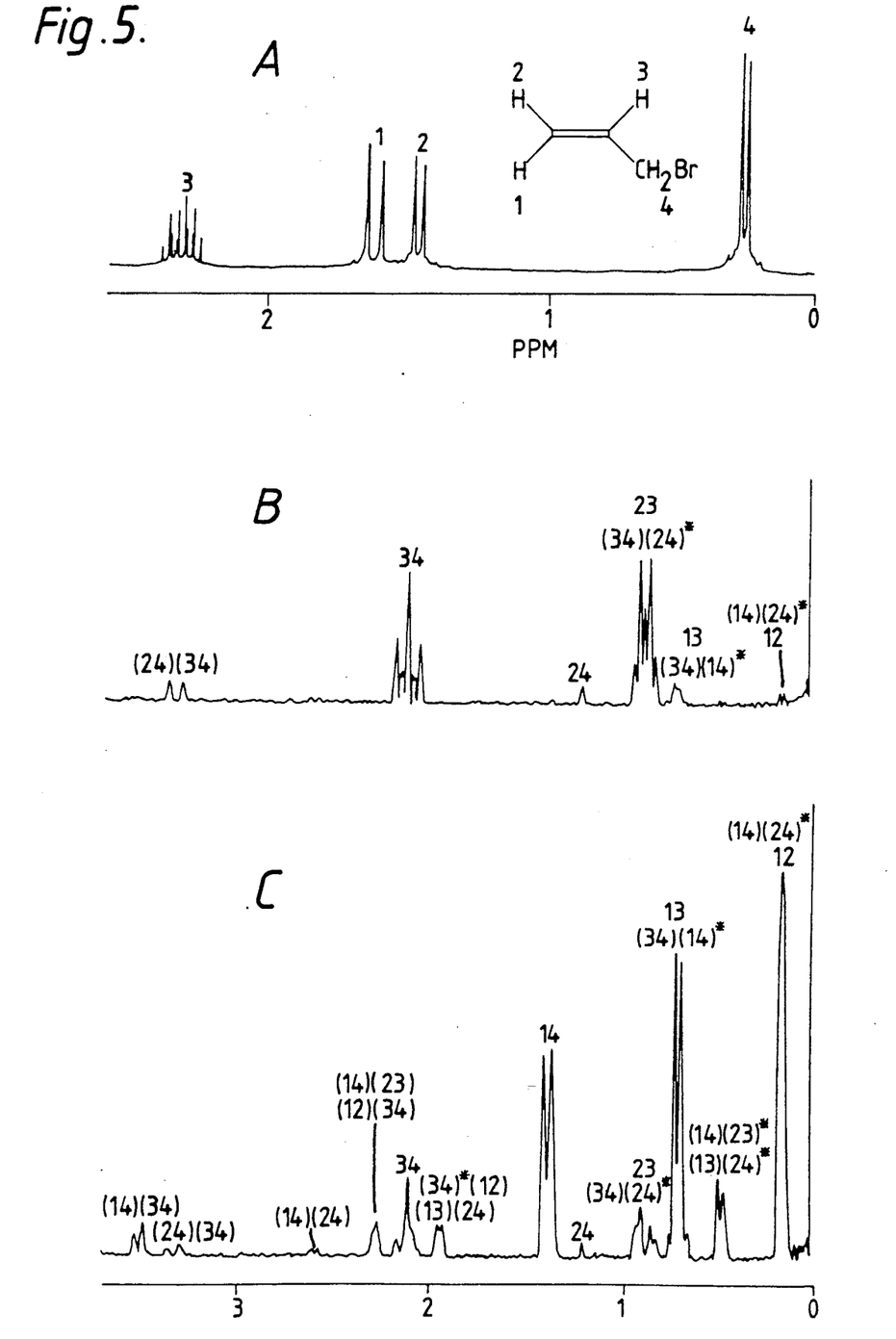
FIG. 5A shows the SQC spectrum of allyl bromide in $CDCl_3$ in a homogeneous magnetic field.
FIG. 5B shows the ZQC spectrum produced in an inhomogeneous magnetic field (1 part in $10^6$) with a conventional pulse sequence ($\tau = 50$ msec)
FIG. 5C shows the ZQC spectrum produced in the same inhomogeneous magnetic field with the pulse sequence MUSE (FIG. 3C) with $\tau = 50$ msec, $\tau' = 100$ msec, $\alpha = 90°$ (A two-spin ZQC between spins 1 and 2 is represented as 12. A four-spin ZQC, 1234, is represented as (12)(34) if it occurs at the sum of the frequencies of the two two-spin ZQCs 12 and 34, and (12)(34)* if it occurs at the difference of their frequencies)

All results given here were obtained on a Varian VXR-300 spectrometer, although preliminary work was also carried out on a Varian XL-300, both operating at 300 MHz for $^1$H. Solutions of 0.2M allyl bromide in CDCl$_3$ were used, except for the result in FIG. 5C which was obtained using a 0.4M solution. With the exception of FIG. 5A all spectra were obtained in a magnetic field with homogeneity reduced to 1 part in $10^6$.

Figure 3:
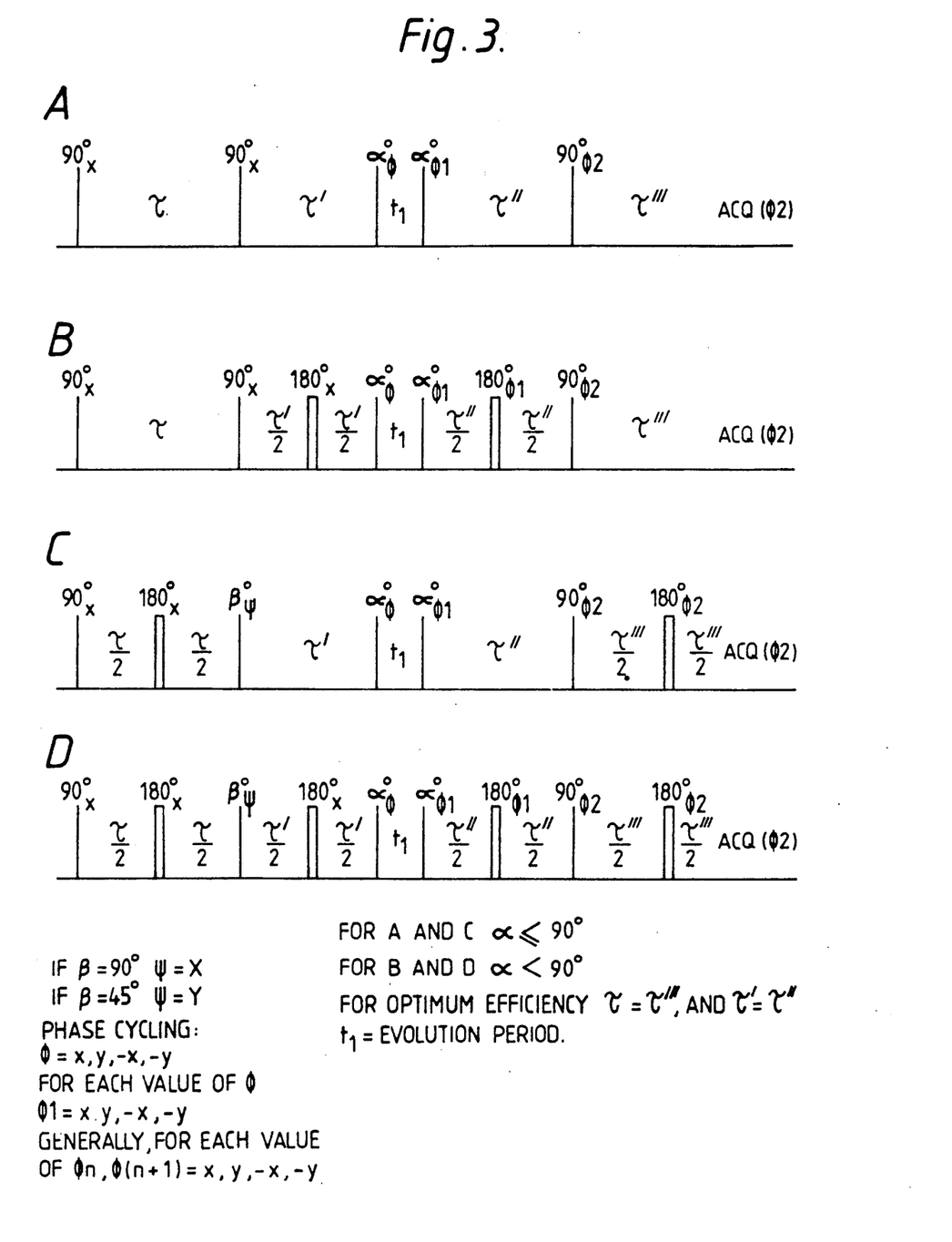
FIGS. 3A–3D illustrate zero-quantum coherence pulse sequences with multiple stage excitation.

The phase cycling for the pulse sequences given in FIG. 3 is defined as follows: $\phi$ is cycled through x,y,−x,−y, and for each value of $\phi$, $\phi_1$ is cycled through x,y,−x,−y. In general $\phi_n$ is cycled through x,y,−x,−y for each value of $\phi(n-1)$. To obtain the spectra presented here, only $\phi$ and $\phi_1$ were phase cycled: additional phase cycling was made redunant by the use of an inhomogeneous magnetic field; $\phi_2$ was cycled as $\phi_1$.

The width of F1 used in each experiment was 2200 Hz; 512 $t_1$ values were used, with 16 transients collected for each. Before Fourier transformation, the $t_1$ dimension of the data set was zero-filled to 4K. Because it was not possible to perform single point acquisition (the method to be preferred in an inhomogeneous magnetic field where F2 will contain no useful information), F2 was set to 80 KHz and 128 points acquired. This allowed, after FT with respect to $t_2$, the approximation to be made that the majority of the signal was contained within one $t_1$ in terferrogram, and it is the FT of this which is given here in each case. A pseudo-echo apodization function was used prior to the FT of each dimension. All other parameters are given elsewhere.

The conventional ZQC spectrum of allyl bromide (FIG. 5B) was obtained using a value of $\tau$ which excites two ZQCs with significant intensity; these are 23 (i.e. the ZQC between spins 2 and 3) and 34. From this spectrum it can be seen that there is a peak at the difference between their frequencies, 24, which indicates some type of connectivity between them. However, uncertainty as to whether the complete spectrum has been excited means that no conclusions can be drawn regarding its conformity to any particular case of either the ZEUS-C, or the ZEUS-D, analysis. The corresponding MUSE-1 spectrum (FIG. 5C) contains many more ZQCs. Since the same value of $\tau$ was used in each case, the extra ZQCs present in FIG. 5C can only result from ZQC-ZQC coherence transfers from the ZQCs present in FIG. 5B, and, due to their intensity in the spectrum, they are most likely to be the result of coherence transfers from 23 and 34. In fact, FIG. 5C contains the complete ZQC spectrum of allyl bromide.

Continuing the ZEUS analysis of 23 and 34, it can be seen that while there is still a peak at the difference of their frequencies, 24, none occurs at their sum. Therefore, assuming the spectrum is complete, the relationship between the two peaks must be a case of ZEUS-C. The spectrum also contains two peaks, 12 and 14, which are related to 23 and 34 in that the difference between their frequencies is in both cases the same. Therefore 23 and 34 must correspond to the case of ZEUS-C represented in FIG. 7C. Similarly, 13 and 24 have peaks both at the difference in their frequencies, (13)(24)*, and at the sum, (13)(24), and are consequently a case of ZEUS-D. The presence of two other pairs of peaks, the difference between which corresponds to the sum (12 and 34) and difference (14 and 23) of the frequencies of 13 and 24 reveals that they correspond to the case of ZEUS-D represented in FIG. 6A. It can be seen from FIG. 5C that some transition frequencies are degenerate, however it should be noted that this does not invalidate the ZEUS analysis. For example, (14)(23)* and (13)(24)* are degenerate, but their constituent spins are the same. A second type of degeneracy is represented by 13 and (34)(14)*. The frequency of the latter is $[(\omega_3 - \omega_4) - (\omega_1 - \omega_4)]$. Clearly the $\omega_4$ terms cancel out giving a frequency of $(\omega_3 - \omega_1)$. Thus the two 4 spins are "invisible" participants in the coherence. For both coherences either a mutual connectivity of 1 and 3 to each other, or to a third type of spin, is implied and hence the ZEUS analysis remains valid

We claim:

1. A method of investigating a sample using nuclear magnetic resonance, the method comprising
   i) applying a magnetic field across said sample;
   ii) creating zero quantum coherences (ZQCs) within said sample during a preparation period of duration $\tau$;
   iii) allowing said zero quantum coherences to evolve for a period of at least $N\Delta + t_1$, where $\Delta$, $t_1$ are constant time intervals and N is an integer;
   iv) at the end of the step iii) applying a coherence transfer pulse to create single quantum coherences whereafter a free induction decay signal is generated;
   v) after a period $\tau$, collecting said free induction decay signal from said sample;
   vi) repeating steps ii) to v) with different values of N; and,
   vii) combining at least some of the free induction decay (FID) signals collected to generate an FID due to a single ZQC.

2. A method according to claim 1, wherein step ii) comprises applying a pulse sequence comprising a 90° radio frequency pulse in an X direction, a relaxation period of duration $\tau/2$, a 180° radio frequency pulse in a Y direction followed by a further relaxation period of duration $\tau/2$ and a final 90° pulse in said X direction, where the magnetic field is applied along a Z direction and said X, Y, and Z directions define an orthogonal coordinate system.

3. A method according to claim 1, wherein $\Delta$ is chosen to be equal to $\pi/\omega_{ZQC}$, where $\omega_{ZQC}$ is the frequency of said single ZQC.

4. A method according to claim 1, wherein step v) comprises adding the FID signal collected after each step iii) in which N is an odd integer.

5. A method according to claim 1, wherein steps ii) and v) include applying a 180° radio frequency pulse at a time $\tau/2$ after commencement of the relevant period.

6. A method according to claim 1, wherein step iii) has a duration of $N\Delta + \tau' + t_1$, an additional pulse $\alpha_\theta$ being applied after a time $N\Delta + \tau'$, wherein $0° < \alpha \leq 90°$, and wherein $\theta$ indicates a direction orthogonal to the magnetic field direction.

7. A method of investigating a sample using nuclear magnetic resonance, the method comprising
  i) applying a magnetic field across said sample;
  ii) creating zero quantum coherences within said sample during a preparation period of duration $\tau$;
  iii) after a period $\tau'$, subsequent to step ii), applying a first coherence transfer pulse $\alpha_\theta$;
  iv) after a further period $t_1$, applying a second coherence transfer pulse $\alpha_{\theta 1}$;
  v) after a further period $\tau''$, applying a coherence transfer pulse to create single quantum coherences to generate a free induction decay signal; and,
  vi) after a period $\tau'''$ collecting said free induction decay signal from said sample.

8. A method according to claim 7, wherein $\tau = \tau'''$ and $\tau' = \tau''$.

9. A method according to claim 7, where $\alpha$ lies between 0° and 180°.

10. A method according to claim 1 wherein $\Delta$ is chosen to be equal to $2\pi/\omega_{ZQC}$, where $\omega_{ZQC}$ is the frequency of said ZQC.

* * * * *